United States Patent
Aronowitz et al.

(10) Patent No.: US 6,759,337 B1
(45) Date of Patent: Jul. 6, 2004

(54) PROCESS FOR ETCHING A CONTROLLABLE THICKNESS OF OXIDE ON AN INTEGRATED CIRCUIT STRUCTURE ON A SEMICONDUCTOR SUBSTRATE USING NITROGEN PLASMA AND PLASMA AND AN RF BIAS APPLIED TO THE SUBSTRATE

(75) Inventors: Sheldon Aronowitz, San Jose, CA (US); Valeriy Sukharev, Cupertino, CA (US); John Haywood, Santa Clara, CA (US); James P. Kimball, San Jose, CA (US); Helmut Puchner, Santa Clara, CA (US); Ravindra Manohar Kapre, San Jose, CA (US); Nicholas Eib, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/464,297

(22) Filed: Dec. 15, 1999

(51) Int. Cl.[7] ............................................. H01L 21/302
(52) U.S. Cl. ........................ 438/706; 438/710; 438/712; 438/723; 216/67
(58) Field of Search ................................ 438/706, 710, 438/711, 712, 720, 723; 216/58, 67, 68

(56) References Cited

U.S. PATENT DOCUMENTS

| | | | | |
|---|---|---|---|---|
| 4,690,746 A | * | 9/1987 | McInerney et al. | .... 204/192.32 |
| 5,266,157 A | * | 11/1993 | Kadomura | ................ 156/345 |
| 5,284,549 A | * | 2/1994 | Barnes et al. | ............... 156/662 |
| 5,714,037 A | * | 2/1998 | Puntambekar et al. | ... 156/643.1 |
| 5,874,367 A | | 2/1999 | Dobson | ...................... 438/787 |
| 5,877,032 A | * | 3/1999 | Guinn et al. | ................... 438/9 |
| 6,136,211 A | * | 10/2000 | Qian et al. | ...................... 216/37 |
| 6,156,620 A | * | 12/2000 | Puncher et al. | ............. 438/400 |
| 6,284,149 B1 | * | 9/2001 | Li et al. | ........................ 216/64 |
| 6,346,489 B1 | * | 2/2002 | Cohen et al. | ................ 438/789 |

OTHER PUBLICATIONS

Bothra, S., et al., "Integration of 0.25 $\mu$m Three and Five Level Inter-connect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Pursuing the Perfect Low-k Dielectric", *Semiconductor International*, vol. 21, No. 10, Sep., 1998, pp. 64–66, 68, 70, 72, and 74.

* cited by examiner

*Primary Examiner*—Lan Vinh
(74) *Attorney, Agent, or Firm*—John P. Taylor

(57) ABSTRACT

A process for etching oxide is disclosed wherein a reproducibly accurate and uniform amount of silicon oxide can be removed from a surface of an oxide previously formed over a semiconductor substrate by exposing the oxide to a nitrogen plasma in an etch chamber while applying an rf bias to a substrate support on which the substrate is supported in the etch chamber. The thickness of the oxide removed in a given period of time may be changed by changing the amount of rf bias applied to the substrate through the substrate support.

17 Claims, 1 Drawing Sheet

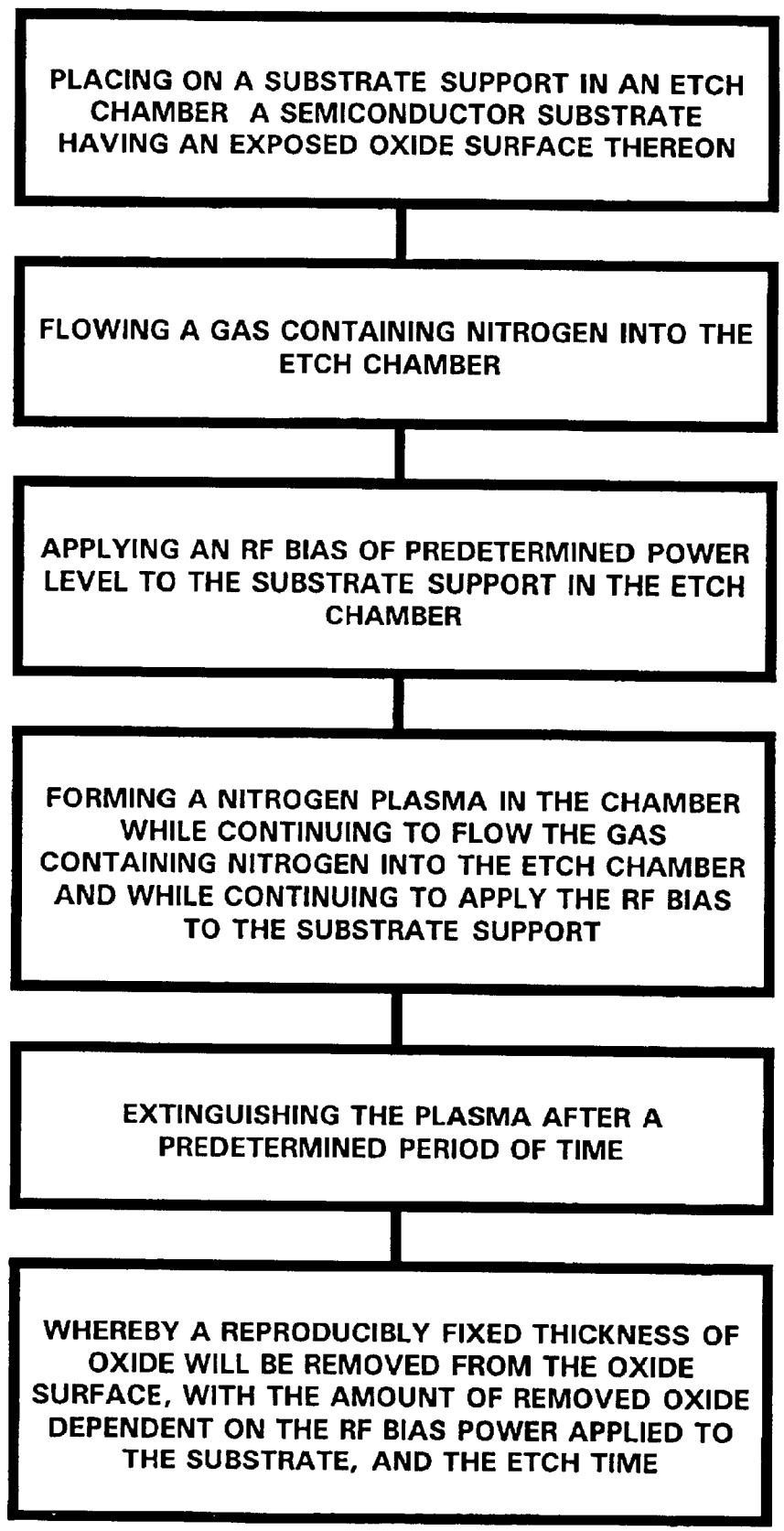

PROCESS FOR ETCHING A CONTROLLABLE THICKNESS OF OXIDE ON AN INTEGRATED CIRCUIT STRUCTURE ON A SEMICONDUCTOR SUBSTRATE USING NITROGEN PLASMA AND PLASMA AND AN RF BIAS APPLIED TO THE SUBSTRATE

BACKGROUND OF THE INVENTION

1. Field of the Invention

This invention relates to a process for use in the construction of integrated circuit structures. More particularly, this invention relates to a process for etching an accurate thickness of oxide from an oxide surface of an integrated circuit structure on a semiconductor substrate using a nitrogen plasma and a rf bias applied to the substrate.

2. Description of the Related Art

In the construction of an integrated circuit structure on a semiconductor substrate, an oxide material, such as silicon oxide, is the material of choice for providing insulation or dielectric material between electrically conductive portions of the integrated circuit structure. The silicon oxide insulation material is normally formed as an oxide layer over other portions of the integrated circuit structure, and the oxide layer may then be subsequently patterned to form the desired shape. Alternatively, portions of oxide may be individually formed over segments of the underlying integrated circuit structure using masks to isolate such portions of oxide from the remainder of the integrated circuit structure, e.g., the formation of field oxide between transistor areas. In either case, the formation of the oxide on the integrated circuit structure is usually carried out either by deposition of silicon oxide on the integrated circuit structure, e.g., by chemical vapor deposition (CVD); or by growth of the silicon oxide, e.g., growth of silicon oxide on an exposed silicon surface, e.g., by oxidation of the silicon using water vapor.

As integrated circuit structures have continued to shrink, both in size of individual components as well as in spacing between such components, it has become necessary to accurately control the thickness of such silicon oxide portions formed on the integrated circuit structures. For example, formation of an MOS transistor may require the formation of a high quality gate oxide of less than 2.5 nanometers (nm) in thickness. This formation of very thin oxide layers has become increasingly difficult to accomplish using conventional deposition or growth processes when thin oxide layers of accurate and uniform thickness are required.

It would, therefore, be useful to provide a process for the accurate and reproducible removal of controlled thicknesses of silicon oxide from a previously formed silicon oxide portion or layer of an integrated circuit structure on a semiconductor substrate.

SUMMARY OF THE INVENTION

In accordance with the invention, a reproducibly accurate and uniform amount of silicon oxide can be removed from the surface of an oxide previously formed over a semiconductor substrate by exposing the oxide to a nitrogen plasma in an etch chamber while applying an rf bias to a substrate support on which the substrate is supported in an etch chamber. The thickness of the silicon oxide removed in a given period of time may be changed by changing the amount of rf bias applied to the substrate through the substrate support.

BRIEF DESCRIPTION OF THE DRAWINGS

The sole FIGURE is a flow sheet illustrating the process of the invention.

DETAILED DESCRIPTION OF THE INVENTION

The invention comprises a process for removing a reproducibly accurate and uniform amount of oxide from an oxide surface of an oxide portion or layer previously formed on an integrated circuit structure over a semiconductor substrate. The process comprises exposing the oxide to a nitrogen plasma in an etch chamber while applying an rf bias to a substrate support on which the substrate is supported in the etch chamber. The thickness of the oxide removed in a given period of time may be changed by changing the power level of the rf bias applied to the substrate through the substrate support. In one embodiment, the nitrogen plasma used to remove the oxide may comprise a remote plasma.

In accordance with the invention, the rf bias applied to the substrate through the substrate support during the oxide etch may comprise an rf bias from an rf power source such as, for example, a 13.56 MHz rf power source. The power level, which in the process of the invention is used to control the thickness of silicon oxide removed during any given etch time period, may range from as small as slightly above zero to a maximum rf bias power level below a power level at which implanting of the substrate would occur. Typically the rf bias power applied to the substrate support will range from just above zero to a maximum of about 100 watts, with rf bias power levels ranging from about 10 watts to about 50 watts being most frequently used.

With respect to the minimum rf bias power level of just slightly above zero, it should be noted that at zero bias power level, the nitrogen plasma can be used for nitridation of the substrate, rather than for etching purposes, and such nitridation can be carried out at zero bias level without sputtering. This capability of nitridation of the oxide on the substrate at zero bias is an advantage because the control of the minimum etch rate (by control of the rf bias power on the substrate) can be maintained to a degree impossible with any wet etch source, since the incorporation of nitrogen into the oxide due to nitridation at zero bias level would be beneficial to some degree, rather than detrimental, e.g., for reducing boron penetration into gate oxide from a polysilicon gate. When it is desired to conduct a deliberate nitridation of the remaining oxide after the oxide etch of the invention, the rf bias on the substrate support may be simply turned off without, however, extinguishing the plasma and then maintaining the plasma in the etch chamber for the desired period of time to carry out the nitridation.

The etch is carried out while maintaining a pressure within the etch chamber sufficient to permit maintenance of a plasma in the etch chamber, yet low enough to avoid damage to the system and to maintain the pressure within the capabilities of the system. Preferably, the pressure will be maintained within a range of from about 1 millitorr to about 1000 millitorr, and most preferably from about 1 millitorr to about 500 millitorr, with pressures ranging from about 1 millitorr to about 100 millitorr being typical. Maintaining the pressure in the etch chamber within these ranges will usually satisfy the above criteria. It should be noted that the higher the pressure, the longer the etch time will be extended for removal of a given thickness of oxide because of the increase in recombination of ions with increased pressure. The flow of the gaseous source of nitrogen into the chamber will be related to the desired pressure maintained within the chamber and the pumping speed of the apparatus.

The nitrogen plasma in the etch chamber is established by flowing a gaseous source of nitrogen, such as $N_2$ or another nitrogen-containing gas such as $N_2O$ or NO, into the etch apparatus and igniting the plasma, using an rf plasma power source maintained within a power range of from a minimum power capable of maintaining the plasma in the etch chamber up to a maximum power level which will not damage either the equipment or the substrate. Maintaining the plasma power source within a power range of from about 250 watts to about 1000 watts will satisfy these criteria. Preferably, the power level will be maintained within a range of from about 250 watts to about 500 watts. Within such a plasma power range, it has been found that the oxide removal rate is independent of the plasma power level.

The temperature at which the etch is carried out is not considered to be crucial, except that maximum temperatures should be below temperatures which might damage the etching apparatus or other portions of the integrated circuit structure on the semiconductor substrate. Temperatures below about 250° C. should be sufficient from a standpoint of equipment damage. However, lower maximum temperatures, such as 60° C. or less, may be preferable from a standpoint of damage to the integrated circuit structure, such as resist masks present on the structure during the etching. Thermal budget requirements may also favor the use of lower maximum temperatures during the etch. In any event, for preserving the reproducible characteristics of the etch, it is preferable that a single operating temperature within the above considerations be selected for conduct of the oxide etch process.

By use of the term "remote plasma" is meant a plasma which is generated at a distance from the substrate target sufficiently far enough from the plasma origin that recombination of at least some of the electrons with the ionic nitrogen species occurs so that the flux of ionic species will be reduced from the initial flux created at the plasma's origin. Etching apparatus having such remote plasma generation capabilities are commercially available, such as, for example, a LAM 9400SE Transformer Coupled Plasma (TCP) reactor or an Applied Materials DPS reactor.

It should be noted that the purpose of the rf bias on the substrate support is to provide a charged electrode which will accelerate and control the flow of the components of the nitrogen plasma toward the substrate to obtain the desired etching of an accurate and reproducible amount of oxide from the substrate. With this in mind, in another embodiment of the invention, a triode reactor apparatus could also be used wherein a charged grid in the apparatus would serve as the charged electrode, instead of (or supplementary to) the biased substrate support, to accelerate and control the flow of the components of the nitrogen plasma toward the surface of the substrate. Such triode reactor apparatus are commercially available, for example, from the LAM company as Model No. 9500.

The oxide etch may be carried out selectively on particular unmasked oxide regions while other masked oxide regions are not etched, e.g., to form very thin gate oxide portions. Alternatively, the oxide etching process of the invention may be used for uniform thing of a blanket deposited layer of oxide where deposition controls alone are inadequate to accurately and reproducibly form a thin oxide layer of uniform thickness.

To further illustrate the practice of the process of the invention, 4.5 nanometers (nm) of silicon oxide was grown on an eight inch diameter silicon substrate. The substrate was then masked and each of three quadrants of the substrate were sequentially exposed to a nitrogen plasma while an rf bias was applied to the substrate support at respective rf bias power levels of 15 watts during etching of the first quadrant, 25 watts during etching of the second quadrant, and 40 watts during etching of the third quadrant, with the fourth quadrant remaining masked as a control. The substrate-biased nitrogen plasma etch of the invention was carried out in a LAM 9400SE TCP remote plasma reactor in which the etch chamber was maintained at a pressure of 40 millitorr and a temperature of about 60° C., with the plasma generator power level maintained at about 500 watts. For each quadrant on the substrate, the oxide etch was carried out for 18 seconds. The respective thicknesses of the control and the oxide layers in each quadrant of the substrate after the respective etches were measured by ellipsometry at 9 points using a Rudolph FEIII Ellipsometer. The minimum, maximum, and average thicknesses of the oxide for the control quadrant and the quadrant subject to the 40 watt bias were determined and are tabulated below.

TABLE

| Bias Power | Average Thickness (nm) | Minimum Measured Thickness (nm) | Minimum Measured Thickness (nm) |
|---|---|---|---|
| Control | 4.617 | 4.603 | 4.627 |
| 40 Watts | 1.689 | 1.674 | 1.696 |

Similar consistency in uniform thickness removal were noted for the quadrants subject respectively to etching with the 15 watt and 25 watt bias on the substrate support.

The same experiment was carried out with the plasma power level reduced to 250 watts, with all other parameters remaining constant. The results indicated that reduction of the plasma power level to 250 watts did not materially change the etch behavior, indicating that for a given etch time period, it is the bias power which determines the oxide etch rate for any given time period.

Thus, it can be seen that the oxide etch process of the invention is capable of removing a uniform thickness of oxide from an oxide layer or portion in a nitrogen plasma etch process by maintaining a particular power level of rf bias on the substrate during the etch, with the thickness of the removed silicon oxide during any given time period varying with the power level of the rf bias maintained on the substrate during the nitrogen plasma etch.

Having thus described the invention what is claimed is:

1. A process for etching away a fixed thickness of silicon oxide from a region of uniform thickness of a silicon oxide layer of an integrated circuit structure on a semiconductor substrate in an etching apparatus to form a thinner silicon oxide region of uniform thickness which comprises:

a) exposing a silicon oxide surface of an integrated circuit structure on a semiconductor substrate to a plasma consisting essentially of a nitrogen plasma generated by a first rf power source maintained at a power level of from about 250 watts to about 1000 watts; and b) maintaining on said semiconductor substrate, an rf bias from a second rf power source maintained at a power level of from above zero up to a power level just below a level at which sputtering of said substrate materials would commence on said semiconductor substrate during said exposure of said silicon oxide surface to said nitrogen plasma;

whereby a fixed thickness of silicon oxide will be removed from said silicon oxide region of uniform thickness, leaving a silicon oxide layer having a thinner region of uniform thickness, with the silicon oxide thickness removed dependent upon the power level of said rf bias on said semiconductor substrate.

2. The process for etching away a fixed thickness of silicon oxide of claim 1 wherein said nitrogen plasma consists essentially of a remote rf plasma generated by said first rf power source at a distance from said oxide surface sufficiently far enough that recombination of at least some of the electrons with the ionic nitrogen species occurs so that the flux of ionic nitrogen species will be reduced from the initial flux created at the nitrogen plasma origin.

3. The process for etching away a fixed thickness of silicon oxide of claim 1 wherein said etching process is carried out in an etching chamber in said etching apparatus maintained at a pressure of from about 1 millitorr to about 1000 millitorr.

4. The process for etching away a fixed thickness of silicon oxide of claim 1 wherein said oxide surface exposed to said nitrogen plasma comprises an oxide layer previously formed on said integrated circuit structure to form a gate oxide thereon.

5. A process for etching away a fixed thickness of silicon oxide in an integrated circuit structure on a semiconductor substrate mounted on a substrate support in an etching chamber of an etching apparatus to form a thin silicon oxide layer of uniform thickness, which comprises:
   a) exposing a silicon oxide surface of an integrated circuit structure on a semiconductor substrate to a plasma consisting essentially of nitrogen formed by igniting said nitrogen plasma in said etching apparatus, using a first rf power source maintained at an rf power level of from about 250 watts up to about 1000 watts; and
   b) maintaining, on said substrate support, during said exposure of said silicon oxide surface to said nitrogen plasma, an rf bias from a second rf power source maintained at a power level ranging from above zero up to a power level just below a level at which sputtering of said substrate materials would commence;
whereby a fixed thickness of silicon oxide will be removed from said silicon oxide surface, leaving a silicon oxide layer of uniform thickness, with the silicon oxide thickness removed dependent upon said power level of said rf bias on said substrate support.

6. The process for etching away a fixed thickness of silicon oxide of claim 5 wherein said power level of said rf bias on said substrate support ranges from above zero up to about 100 watts.

7. The process for etching away a fixed thickness of silicon oxide of claim 5 wherein said nitrogen plasma is maintained using said first rf power source at an rf power level of from about 250 watts to about 500 watts.

8. The process for etching away a fixed thickness of silicon oxide of claim 5 wherein said nitrogen plasma generated by said first rf power source consists essentially of a remote nitrogen plasma.

9. The process for etching away a fixed thickness of silicon oxide of claim 5 wherein said etching chamber is maintained at a pressure of from about 1 millitorr to about 500 millitorr.

10. The process for etching away a fixed thickness of silicon oxide of claim 5 wherein said oxide surface exposed to said nitrogen plasma comprises an oxide layer previously formed on said integrated circuit structure.

11. The process for etching away a fixed thickness of silicon oxide of claim 5 wherein said oxide surface exposed to said nitrogen plasma comprises unmasked portions of an oxide layer previously formed on said integrated circuit structure.

12. The process for etching away a fixed thickness of silicon oxide of claim 5 wherein said oxide surface exposed to said nitrogen plasma comprises a surface of one or more oxide portions previously formed on said integrated circuit structure.

13. A process for etching away a fixed thickness of silicon oxide in one or more unmasked silicon oxide regions of a silicon oxide layer in an integrated circuit structure on a semiconductor substrate to form one or more very thin gate oxide portions of uniform thickness in said unmasked regions of said silicon oxide layer which comprises:
   a) placing said semiconductor substrate on a substrate support in an etching chamber of an etching apparatus, said chamber maintained at a pressure of from about 1 millitorr to about 500 millitorr;
   b) exposing one or more unmasked regions of a silicon oxide layer on an integrated circuit structure on a semiconductor substrate to a plasma consisting essentially of nitrogen maintained at a power level of from about 250 watts to about 500 watts by a first rf power source and formed by flowing nitrogen gas into said etching apparatus, and then igniting a plasma in said etching apparatus; and
   c) maintaining, on said substrate support, during said exposure of said unmasked regions of said silicon oxide layer to said nitrogen plasma, an rf bias maintained at an rf power level ranging from above zero up to about 100 watts by a second rf power source;
whereby a fixed thickness of silicon oxide will be removed from said unmasked regions of said silicon oxide layer to thereby form said very thin gate oxide portions, with the silicon oxide thickness removed dependent upon said rf power level of said rf bias on said semiconductor substrate.

14. The process for etching away a fixed thickness of silicon oxide of claim 13 wherein said power level of said second rf power source generating said rf bias on said substrate ranges from above zero up to about 50 watts.

15. The process for etching away a fixed thickness of silicon oxide of claim 13 wherein said etching chamber is maintained at a pressure of from about 1 millitorr to about 200 millitorr.

16. The process for etching away a fixed thickness of silicon oxide of claim 13 wherein said nitrogen plasma generated by said first rf power source consists essentially of a remote nitrogen plasma.

17. A process for etching away a fixed thickness of a silicon oxide layer having regions of uniform thickness in an integrated circuit structure on a semiconductor substrate in an etching apparatus to thereby form a thin silicon oxide layer having regions of uniform thickness which comprises:
   a) forming, in an integrated circuit structure on a semiconductor substrate, a silicon oxide layer having regions of uniform thickness;
   b) exposing said regions of said silicon oxide layer in said integrated circuit structure on said semiconductor substrate to a remote plasma consisting essentially of a remote nitrogen plasma generated by a first rf power source maintained at a power level of from about 250 watts to about 500 watts to remove a uniform thickness of silicon oxide from said exposed regions of uniform thickness of said silicon oxide layer; and
   c) maintaining on said semiconductor substrate an rf bias generated by a second rf power source maintained at a power level of from about 10 watts to about 50 watts during said exposure of said exposed regions of said silicon oxide layer to said remote nitrogen plasma;

whereby a fixed thickness of silicon oxide will be removed from said exposed regions of said silicon oxide layer, with the silicon oxide thickness removed dependent upon the power level on said semiconductor substrate of said rf bias from said second rf power source.

* * * * *